United States Patent
Hayes et al.

(10) Patent No.: US 11,639,398 B2
(45) Date of Patent: May 2, 2023

(54) PHOTOSENSITIVE BISMALEIMIDE COMPOSITION

(71) Applicant: Rohm and Haas Electronic Materials LLC, Marlborough, MA (US)

(72) Inventors: Colin Hayes, Hudson, MA (US); Colin Calabrese, Marlborough, MA (US); Michael K. Gallagher, Hopkinton, MA (US); Kevin Y. Wang, Shrewsbury, MA (US); Robert K. Barr, Shrewsbury, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 17/106,261

(22) Filed: Nov. 30, 2020

(65) Prior Publication Data
US 2021/0198389 A1     Jul. 1, 2021

Related U.S. Application Data

(60) Provisional application No. 62/954,734, filed on Dec. 30, 2019.

(51) Int. Cl.
| | |
|---|---|
| *C08F 2/46* | (2006.01) |
| *C08F 2/50* | (2006.01) |
| *C08G 61/04* | (2006.01) |
| *G03F 7/028* | (2006.01) |
| *C08F 222/40* | (2006.01) |
| *C08G 73/10* | (2006.01) |
| *G03F 7/20* | (2006.01) |
| *C08F 220/18* | (2006.01) |
| *C08F 2/38* | (2006.01) |
| *C08F 236/04* | (2006.01) |
| *C08F 212/08* | (2006.01) |
| *C08K 5/3417* | (2006.01) |
| *C08K 5/33* | (2006.01) |
| *C08K 5/372* | (2006.01) |

(52) U.S. Cl.
CPC ............. *C08F 2/50* (2013.01); *C08F 2/38* (2013.01); *C08F 212/08* (2013.01); *C08F 220/18* (2013.01); *C08F 222/402* (2020.02); *C08F 236/04* (2013.01); *C08G 73/10* (2013.01); *G03F 7/028* (2013.01); *G03F 7/2002* (2013.01); *C08K 5/33* (2013.01); *C08K 5/3417* (2013.01); *C08K 5/3725* (2013.01)

(58) Field of Classification Search
CPC .... C08F 212/22; C08F 212/08; C08F 212/32; C08F 212/12; C08F 2/38; C08F 2/50; C08F 222/402; C08F 236/04; C08F 220/18; C08F 226/06; G03F 7/027; G03F 7/2002; G03F 7/031; G03F 7/028; C09D 125/18; C08G 73/10; C08L 25/18; C08L 79/085; C08L 2203/16; C08K 5/33; C08K 5/3417; C08K 5/3725
USPC ........... 522/50, 49, 6, 71, 189, 184, 1; 520/1
See application file for complete search history.

(56) References Cited

U.S. PATENT DOCUMENTS

| | | |
|---|---|---|
| 4,416,975 A | 11/1983 | Green et al. |
| 6,835,758 B2 | 12/2004 | Biro et al. |
| 6,872,654 B2 | 3/2005 | Chen et al. |
| 7,550,825 B2 | 6/2009 | Santos et al. |
| 8,710,682 B2 | 4/2014 | Dershem et al. |
| 9,261,782 B2 | 2/2016 | Kandanarachchi et al. |
| 2006/0009539 A1 | 1/2006 | Herr et al. |
| 2013/0072615 A1 | 3/2013 | Muro et al. |
| 2015/0344627 A1 | 12/2015 | Mizori |
| 2017/0058102 A1* | 3/2017 | Kushihara ............. C08G 73/12 |
| 2017/0174802 A1 | 6/2017 | Romer et al. |
| 2018/0362715 A1 | 12/2018 | Hsieh |
| 2019/0292389 A1* | 9/2019 | Gouzman ............. C08G 73/12 |
| 2020/0079954 A1* | 3/2020 | Kushihara ............. C08G 59/68 |
| 2020/0166844 A1 | 5/2020 | Okada et al. |

FOREIGN PATENT DOCUMENTS

| | | | |
|---|---|---|---|
| CN | 106103585 | * | 11/2016 |
| CN | 1717628 A | | 5/2019 |
| JP | 2005196030 A | | 7/2005 |
| JP | 2004091479 A | | 3/2008 |
| JP | 2010-282003 | * | 12/2010 |
| JP | 2010282003 A | | 12/2010 |
| JP | 2011027770 A | | 2/2011 |
| JP | 06271272 B2 | | 1/2018 |
| JP | 06281826 B2 | | 2/2018 |
| JP | 2018036504 A | | 3/2018 |
| WO | WO-2016070434 A1 * | | 5/2016 ............... C07F 7/18 |
| WO | 2018237377 A1 | | 12/2018 |

OTHER PUBLICATIONS

Nagoshi et al, JP 2010-282003 Machine Translation, Dec. 16, 2020 (Year: 2010).*
Robello et al, CN 106103585 Machine Translation, Nov. 9, 2016 (Year: 2016).*
Fang et al, WO 2016070434 Machine Translation, May 12, 2016 (Year: 2016).*
Huang et al, Polycarbosilane-modified styrene-based polymers with ultra-low dielectric constant, greatly enhanced mechanical strength and thermal stability, Nov. 24, 2017, European Polymer Journal, 98, 347-353 (Year: 2017).*

(Continued)

*Primary Examiner* — Jessica Whiteley
(74) *Attorney, Agent, or Firm* — S. Matthew Cairns

(57) ABSTRACT

The present disclosure relates to a photosensitive composition comprising a photoinitiator and a bismaleimide component, photopolymers comprising the photosensitive composition and their use, especially in electronic devices. The bismaleimide component includes a bismaleimide compound or a bismaleimide oligomer.

17 Claims, No Drawings

(56) References Cited

OTHER PUBLICATIONS

Huang et al, Photoactive polymers with Benzocyclobutene/Silacyclobutane Dual Crosslinked Structure and Low dilelectric Constant, 2017, Journal of Polymer Science, Part A: Polymer Chemistry, 2017, 55, 1920-1928 (Year: 2017).*

Wagner, et al, "Cure kinetics of bismaleimides as basis for polyimide-like inks for PolyJet(TM)-3D-Printing," Journal of Applied Polymer Science, 2019, pp. 47244, vol. 136.

Fan, et al, "UV curing of a liquid based bismaleimide-containing polymer system", eXPRESS Polymer Letters, 2007, vol. 1, No. 6, pp. 397.

\* cited by examiner

PHOTOSENSITIVE BISMALEIMIDE COMPOSITION

FIELD OF THE DISCLOSURE

The present disclosure relates to a photosensitive composition comprising a photoinitiator and a bismaleimide component, photopolymers comprising the photosensitive composition and their use, especially in electronic devices.

BACKGROUND INFORMATION

The rapid development of the microelectronics industry has created a great demand for dielectric polymeric materials used for lithography with improved electrical characteristics for packaging each succeeding generation of microelectronic devices. With speed at a premium, computers and other electronic devices are moving to higher frequencies. Many systems now operate in the 1 to 10 GHz range, while new applications will run at frequencies as high as 20 GHz, or 30 GHz, or up to 100 GHz.

Plastics are generally considered insulators, but they can transmit some electrical energy at higher frequencies. The effectiveness of a material as an insulator is usually measured by quantities like dielectric constant (Dk) and dissipation factor (Df). Dk addresses how well an insulator stores electrical energy so as to isolate electrical elements from each other and the ground. Dissipation factor (Df or tan δ) is the electrical property of plastics and other electrical insulating materials. It is defined as the reciprocal of the ratio between the insulating materials' capacitive reactance to its resistance (Equivalent Series Resistance or ESR) at a specified frequency.

The more conductive a material, the greater its Dk. Good dielectrics also tend to have a low dissipation factor (Df). That is, they do not let the charge they hold dissipate easily and they lose little energy as heat as the electric field reverses rapidly at high frequencies. The low dissipation factors indicated high-quality, high performance electrical or electronic systems. It is important for plastic insulators in high-frequency applications. Therefore, it would be desirable to provide low dielectric constant lithographic materials having low dissipation factors used in microelectronics with high frequency.

DETAILED DESCRIPTION

Many aspects and embodiments have been described above and are merely exemplary and not limiting. After reading this specification, skilled artisans appreciate that other aspects and embodiments are possible without departing from the scope of the present disclosure.

As used throughout this specification, the following abbreviations shall have the following meanings, unless the context clearly indicates otherwise: ° C.=degree Celsius; g=gram; nm=nanometer; μm=micron=micrometer; mm=millimeter; sec.=second; and min.=minutes. All amounts are percent by weight ("wt. %") and all ratios are molar ratios, unless otherwise noted. All numerical ranges are inclusive and combinable in any order, except where it is clear that such numerical ranges are constrained to added up to 100%. Unless otherwise noted, all polymer and oligomer molecular weights are weight average molecular weights ("Mw") with unit of g/mol or Dalton, and are determined using gel permeation chromatography compared to polystyrene standards.

The articles "a", "an" and "the" refer to the singular and the plural, unless the context clearly indicates otherwise. As used herein, the term "and/or" includes any and all combinations of one or more of the associated items. The term "curable" refers to a material that becomes harder and less soluble in solvents under the conditions of use.

The terms "film" and "layer" are used interchangeably through this specification. The term "monomer" refers to a molecule that can undergo polymerization or copolymerization thereby contributing constitutional units to the essential structure of a macromolecule (a polymer). The term "oligomer" refers to a polymer having a finite and moderate number of repeating monomers structural units. Oligomers of the present disclosure typically have 2 to about 100 repeating monomer units, or from 2 to about 30 repeating monomer units, or from 2 to about 10 repeating monomer unit. The term "polymer" refers to molecules composed of repeating monomer units. The term "polymer" used herein refers to a homopolymer composed of one monomer unit, and/or a copolymer composed of two or more different monomers as polymerized units. Polymers in the present disclosure may contain organic and/or inorganic additives.

The term "alkoxy" refers to group RO—, where R is an alkyl group. The term "alkyl" refers to a group derived from an aliphatic hydrocarbon and includes a linear, a branched, or a cyclic group. A group "derived from" a compound, indicates the radical formed by removal of one or more hydrogen or deuterium. In some embodiments, an alkyl has from 1 to 20 carbon atoms.

The term "aromatic compound" refers to an organic compound comprising at least one unsaturated cyclic group having 4n+2 delocalized pi electrons. The term "aryl" refers to a group derived from an aromatic compound having one or more points of attachment. The term includes groups which have a single ring and those which have multiple rings which can be joined by a single bond or fused together. Carbocyclic aryl groups have only carbons in the ring structures. Heteroaryl groups have at least one heteroatom in a ring structure. The term "alkylaryl" refers to an aryl group having one or more alkyl substituents. The term "aryloxy" is refers to a group RO—, where R is an aryl group.

The term "adjacent" as it refers to substituent groups that are bonded to carbons that are joined together with a single or multiple bond. Exemplary adjacent R groups are shown below:

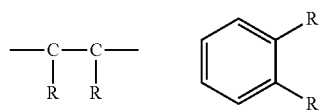

The term "liquid composition" refers to a liquid medium in which a material is dissolved to form a solution, a liquid medium in which a material is dispersed to form a dispersion, or a liquid medium in which a material is suspended to form a suspension or an emulsion. The term "solvent" refers to an organic compound that is a liquid at room temperature (20-25° C.). The term is intended to encompass a single organic compound or mixture of two or more organic compounds.

Unless otherwise defined, all technical and scientific terms used herein have the same meaning as commonly understood by one of ordinary skill in the art to which this disclosure belongs. Although methods and materials similar or equivalent to those described herein can be used in the practice or testing of embodiments of the present disclosure, suitable methods and materials are described below. In addition, the materials, methods, and examples are illustrative only and not intended to be limiting.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

To the extent not described herein, many details regarding specific materials, processing acts, and circuits are conventional and may be found in textbooks and other sources within the photoresist, organic light-emitting diode display, photodetector, photovoltaic cell, and semiconductive member arts.

There is provided a photosensitive composition comprising a photoinitiator and a bismaleimide (BMI) component, wherein the photoinitiator is an oxime ester compound present from 0.5 to 25 percent by weight based on the weight of the bismaleimide component.

In one aspect, the bismaleimide component is a bismaleimide compound. The bismaleimide compound can be represented by a general formula (I) as shown below:

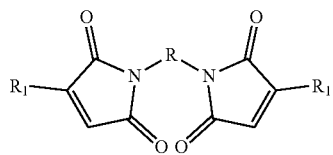

where R is substituted or unsubstituted linking group selected from the group consisting of alkylene, alkylenearyl, cycloalkylene, cycloalkylenearyl, cycloalkylalkylene dialkyl siloxane, diarylsiloxane and combinations thereof; and $R_1$ is selected from the group consisting of hydrogen, deuterium, halogen, cyano, methyl, vinyl, allyl, isoprene, a substituted or unsubstituted isoprene having 1-100 carbon atoms, and combinations thereof. In one embodiment, R can be the alkylene group having 1 to 100 carbon atoms, or 2 to 50 carbon atoms, or 5 to 20 carbon atoms.

In another aspect, the bismaleimide compound can be a bismaleimide oligomer. The bismaleimide oligomer can be represented by a general formula (II) as shown below:

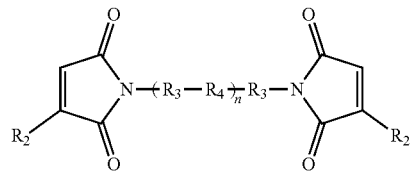

where $R_2$ is H or $CH_3$; $R_3$ is $C_1$-$C_{40}$ alkyl, alkyl polydimethyl siloxane, or alkylaryl;
$R_4$ is selected from the group consisting of

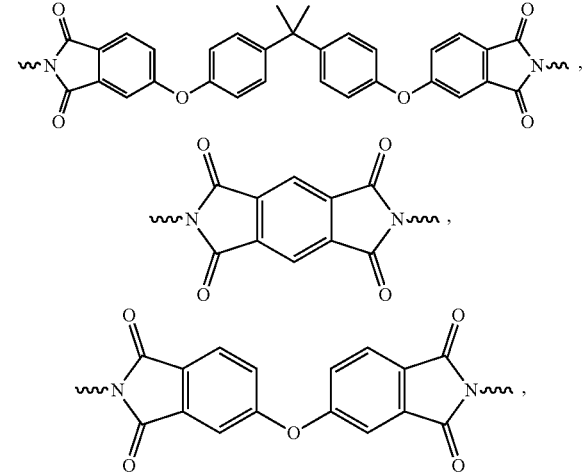

and combinations thereof, and
n is an integer of 1 to 10.

Examples of the bismaleimide component can include, but are not limited to, C36 alkylenediamine imides such as 1,1'-((4-hexyl-3-octylcyclohexane-1,2-diyl)bis(octane-8,1-diyl))bis(1H-pyrrole-2,5-dione) (BMI-689, commercially available from Designer Molecules Inc.), 1,6'-bismaleimide-(2,2,4-trimethyl)hexane (TMH-BMI, commercially available from Daiwa Kasei Industry Co., Ltd., Japan), 1,3-bis (3-maleimidephenoxy)benzene (APB-BMI, commercially available from Hampford Research, Inc.), 1,1'-[2,2'-Bis(trifluoromethyl)[1,1'-biphenyl]-4,4'-diyl]bis[1H-pyrrole-2,5-dione] (MA-TFMB), 2,2-Bis[4-(4-maleimidophenoxy)phenyl]hexafluoropropane (BMP3 CF3), and 1,3-Bis(4-maleimidophenoxy)benzene (1,3 Bis 4-PhoBMI), 1-(3-(5-(2,5-dioxo-2,5-dihydro-1H-pyrrol-1-yl)benzo[d]oxazol-2-yl)phenyl)-1H-pyrrole-2,5-dione, 1,1'-(sulfonylbis(4,1-phenylene))bis(1H-pyrrole-2,5-dione), 1,1'-(sulfonylbis(3,1-phenylene))bis(1H-pyrrole-2,5-dione), 1,1'-((1,1,3,3-tetramethyldisiloxane-1,3-diyl)bis(propane-3,1-diyl))bis (1H-pyrrole-2,5-dione), 1,1'-(methylenebis(2-ethyl-6-methyl-4,1-phenylene))bis(1H-pyrrole-2,5-dione) (BMI5100, commercially available as from Daiwa Kasei Industry Co., Ltd., Japan), 1,1'-(1,3-phenylene)bis(1H-pyrrole-2,5-dione) (BMI3000H, commercially available as from Daiwa Kasei Industry Co., Ltd., Japan), 1,1'-(decane-1,10-diyl)bis(1H-pyrrole-2,5-dione), 1,1'-(1,3,5-triazine-2,4-diyl)bis(1H-pyrrole-2,5-dione), 1,1'-((perfluoropropane-2,2-diyl)bis(4,1-phenylene))bis(1H-pyrrole-2,5-dione), 1,1'-((9H-fluorene-9,9-diyl)bis(4,1-phenylene))bis(1H-pyrrole-2,5-dione), and 1,1'-(methylenebis(4,1-phenylene))bis(1H-pyrrole-2,5-dione). More commercial bismaleimide components can include, but are not limited to, BMI 1400, BMI 1500, BMI 1700, BMI 4000, and BMI 5000, which are commercially available from Designer Molecules Inc.

The oxime ester compound can be present from 0.5 to 25 percent by weight, or from 1 to 25 percent by weight, or from 2 to 10 percent by weight, or from 5 to 15 percent by weight based on the weight of the bismaleimide component. Examples of the oxime ester compound can include, but are not limited to, the compound shown below and the combinations thereof:

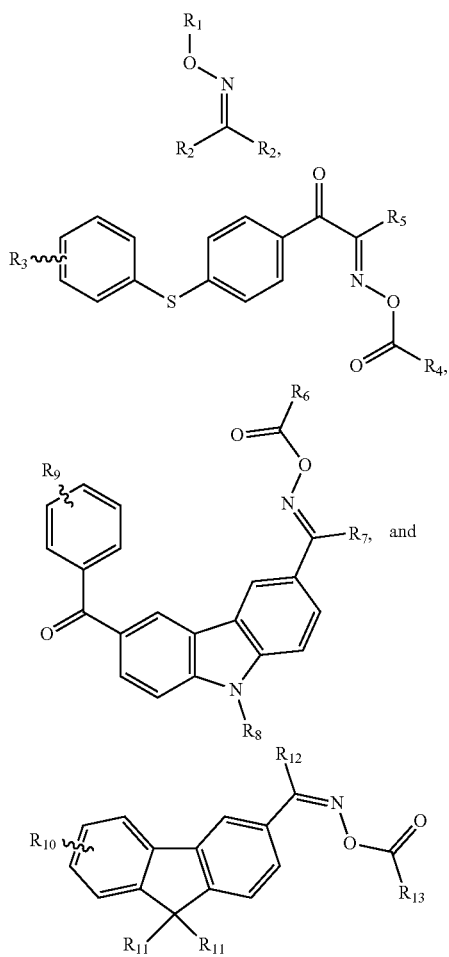

where $R_1$ is $CO_2Ph$, $CO_2Me$, or $CO_2Et$; $R_2$ is ketone, aryl, aryl ether, sulfide aryl ether, or alkyl; $R_3$ is H, OH, COOH, or methyl; each of $R_4$ and $R_5$ is independently an alkyl group having 1-10 carbon atoms, a cycloalkyl group, or a phenyl group; each of $R_6$ and $R_7$ is independently an alkyl group having 1-10 carbon atoms, a cycloalkyl group, or a phenyl group; $R_8$ is an alkyl group having 1 to 5 carbon atoms; $R_9$ is H, methyl, or acetyl; $R_{10}$ is $NO_2$, or ArCO; $R_{11}$ is an alkyl group of 1 to 6 carbon atoms; and each of $R_{12}$ and $R_{13}$ is independently an alkyl group having 1-10 carbon atoms, a cycloalkyl group, or a phenyl group. Ar is an aryl group such as a phenyl group or tolyl group.

Examples of the commercial products of the oxime ester compounds can include, but are not limited to, IRGACURE OXE 01 (1,2-octanedione, 1-[4-(phenylthio)-, 2-(O-benzoyloxime)] and IRGACURE OXE 02 (ethanone, 1-[9-ethyl-6-(2-methylbenzoyl)-9H-carbazol-3-yl]-, 1-(O-acetyloxime)), commercially available from BASF; ADEKA ARKLS NCI-930 and ADEKA Optomer N-1919, commercially available from ADEKA CORPORATION; and DFI-091, commercially available from Daito Chemix, Corporation. More descriptions of the oxime ester compounds can be found in U.S. Pat. Application No 2017/0003588 A1, the entire contents of which are incorporated herein by reference.

In one embodiment, the oxime ester compound can be

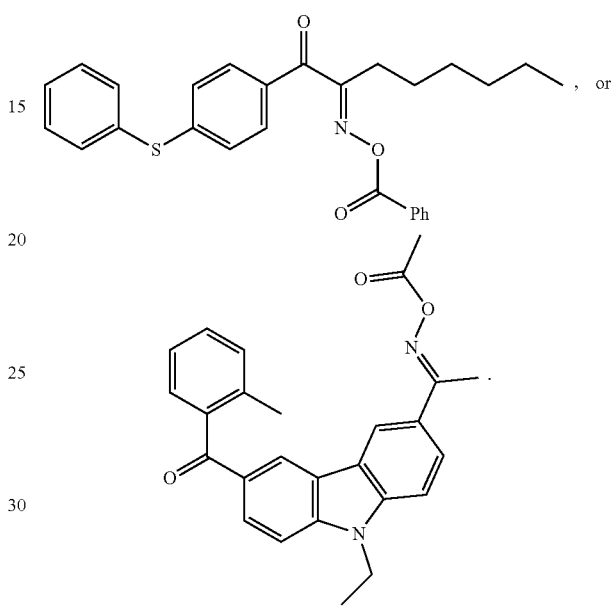

In one aspect, the photosensitive composition can further comprise a thermosetting polymer. The thermosetting polymer can then be crosslinked under radiation. In one embodiment, the thermosetting polymer can be represented by a general formula (III) as shown below:

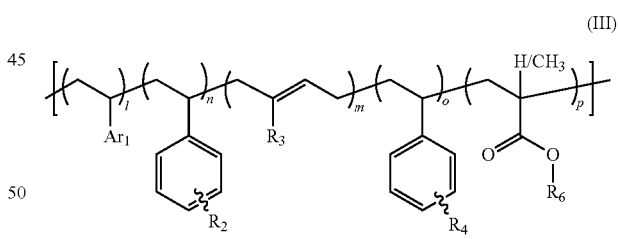

where Ar is heterocycle containing a N, S, O, or P atom; $R_2$ is H, $CH_3$, ethyl, or t-butyl; $R_3$ is H, $CH_3$, $C_1$-$C_{12}$ alkyl, or $C_1$-$C_{12}$ alkene; $R_4$ is cyclobutene, 1-cyclobutene, 1-oxycyclobutebe, or α-methyl cyclobutene; l is an integer of 0 to 10; $R_6$ is an alkyl group of 1 to 12 carbon atoms, a cycloalkyl group, or an aryl group; n is an integer of 5 to 70; m is an integer of 5 to 50; and o is an integer of 5 to 50; and p is an integer of 5 to 50, wherein l+n+m+o+p=100.

In another aspect, the photosensitive composition can further comprise at least one polymerizable monomer. The polymerizable monomer can be an arylcyclobutene monomer. In one embodiment, the arylcyclobutene monomer has Formula (IV), (V) or (VI), as shown below:

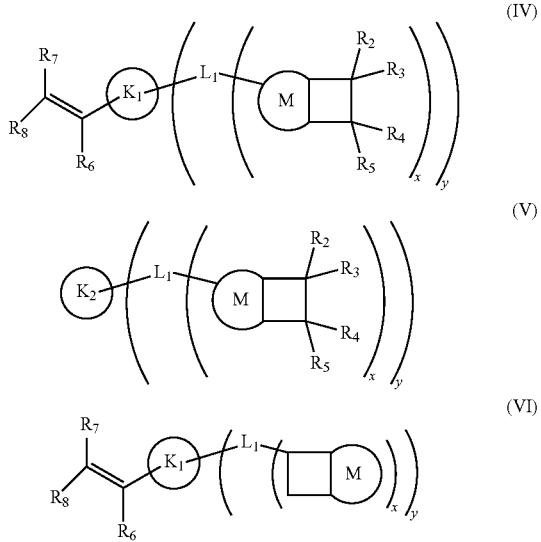

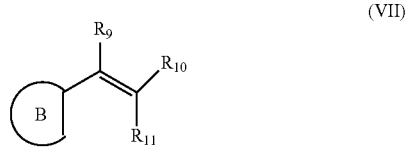

where:
$K^1$ is a divalent group selected from the group consisting of alkyl, aryl, carbocyclic aryl, polycyclic aryl, heteroaryl, aryloxy, arylalkyl, carbonyl, ester, carboxyl, ether, thioester, thioether and tertiary amine;
$L^1$ is a covalent bond, or a multivalent linking group; M is a substituted or unsubstituted divalent aromatic or polyaromatic radical group, or a substituted or unsubstituted divalent heteroaromatic radical group;
$R_2$-$R_5$ are identical or different and each is independently selected from the group consisting of substituted or unsubstituted alkyl, substituted or unsubstituted alkyloxy, substituted or unsubstituted aryl, substituted or unsubstituted aryloxy, alkylthio, arylthiol, substituted alkyl amino, and substituted aryl amino;
$R_6$-$R_8$ are identical or different and each is independently selected from the group consisting of hydrogen, deuterium, cyano, halo, methyl, vinyl, allyl, isoprene, and a substituted or unsubstituted isoprene having 1-100 carbon atoms;
$K^2$ is a polymerizable functional group; and
x and y are the same or different and are an integer from 1-5, wherein when $L^1$ is a covalent bond, y=1.

Examples of the arylcyclobutene monomer can include, but are not limited to, 1-(4-vinyl phenoxy)-benzocyclobutene, 1-(4-vinyl methoxy)-benzocyclobutene, 1-(4-vinyl phenyl)-benzocyclobutene, 1-(4-vinyl hydroxynaphthyl)-benzocyclobutene, 4-vinyl-1-methyl-benzocyclobutene, 4-vinyl-1-methoxy-benzocyclobutene, and 4-vinyl-1-phenoxy-benzocyclobutene.

The polymerizable monomer in the photosensitive composition as described above can further comprise at least one dienophile monomer as shown in general formula (VII):

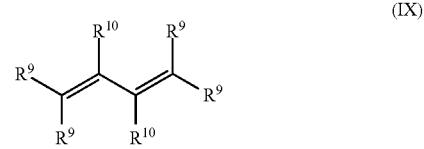

where B is hydrogen, substituted or unsubstituted alkyl, substituted or unsubstituted aromatic moiety, substituted or unsubstituted heteroaromatic moiety, hydroxy, or substituted or unsubstituted alkyloxy; and $R_9$-$R_{11}$ are identical or different and each independently is selected from the group consisting of hydrogen, methyl, vinyl, allyl, isoprene, a substituted or unsubstituted isoprene having 1-100 carbon atoms, a substituted or unsubstituted alkyl group having 1 to 100 carbon atoms, a halogen, a cyano, a substituted or unsubstituted aryl group having 6 to 100 carbon atoms, a substituted or unsubstituted heteroaryl group having 6 to 100 carbon atoms, and combinations thereof.

In one embodiment, the dienophile monomer can be an aromatic vinyl monomer, which is has Formula (VIII):

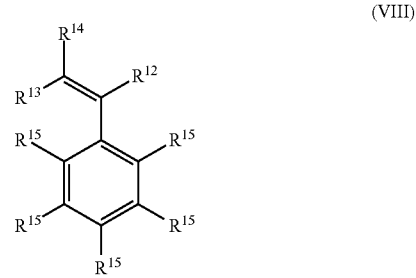

where:
$R^{12}$-$R^{14}$ are the same or different at each occurrence and is selected from the group consisting of hydrogen and $C_{1-5}$ alkyl; and
$R^{15}$ is the same or different at each occurrence and is selected from the group consisting of hydrogen and $C_{1-5}$ alkyl, where adjacent $R^{15}$ groups can be joined to form a fused 6-membered aromatic ring.

Examples of the aromatic vinyl monomer can include, but are not limited to, styrene, α-methylstyrene, vinyl toluene, 1-vinylnaphthalene, and 2-vinylnaphthalene.

The polymerizable monomer in the photosensitive composition as described above can further comprise at least one diene monomer. The diene monomer can have a general formula (IX), as shown below:

$$(IX)$$

where $R^9$ is the same or different at each occurrence and is selected from hydrogen and methyl; and $R^{10}$ is the same or different at each occurrence and is selected from hydrogen, $C_{1-5}$ alkyl, $C_{1-5}$ alkoxy, $C_{1-5}$ thioalkyl, and $C_{5-12}$ alkenyl. Examples of diene monomers can include, but are not limited to, butadiene, isoprene, 1,3-pentadiene, 2,4-hexadiene, cyclopentadiene, β-myrcene, ocimene, cyclooctadiene, farnesene, and polymerizable terpenes.

The polymerizable monomer in the photosensitive composition as described above can further comprise at least one heterocycle containing monomer. The heterocycle containing monomer can be a vinyl substituted $C_{3-12}$ heterocycle, or a vinyl-substituted $C_{3-5}$ heterocycle. In one embodiment, the heterocycle can be further substituted with one or more $C_{1-6}$ alkyl, a $C_{6-12}$ carbocyclic aryl, or a $C_{3-12}$ heteroaryl.

The heterocycle containing monomer is selected from the group consisting of nitrogen heterocycles, sulfur heterocycles, nitrogen-sulfur heterocycles, and substituted derivatives thereof.

In one embodiment, the heterocycle containing monomer can be a nitrogen heterocycle containing monomer. The nitrogen heterocycle containing monomer can comprise at least one ring nitrogen. Examples of the nitrogen heterocycle containing comonomer can include, but are not limited to, pyrrole, pyridine, diazines, triazines, imidazoles, benzoimidazoles, and quinolones.

The nitrogen heterocycle containing monomer can have a general formula (X), as shown below:

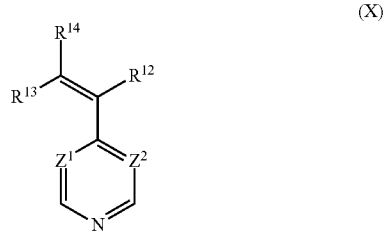

(X)

where $Z^1$ and $Z^2$ are the same or different and are N or $CR^{15a}$; $R^{12}$-$R^{14}$ and $R^{15a}$ are the same or different at each occurrence and are selected from the group consisting of hydrogen and $C_{1-5}$ alkyl.

Examples of such nitrogen heterocycle containing monomer can include, but are not limited to, 4-vinyl pyridine, 4-vinyl-1,3-diazine, 2-vinyl-1,3,5-triazine, and 4-methyl-5-vinyl-1,3-thiazole.

In another embodiment, the heterocycle containing monomer can be a sulfur heterocycle containing monomer. The sulfur heterocycle containing monomer can comprise at least one ring sulfur. Examples of sulfur heterocycle containing monomers can include, but are not limited to, thiophene, benzothiophene, and dibenzothiophene.

In yet another embodiment, the heterocycle containing monomer can be a nitrogen-sulfur heterocycle containing monomer. The nitrogen-sulfur heterocycle containing monomer can comprise at least one ring nitrogen and one ring sulfur. Examples of the nitrogen-sulfur heterocycle containing monomers can include, but are not limited to thiazole, thiadiazole, and thiadiazine.

At least one solvent can be present in the photosensitive composition as described above. Examples of the solvents can include, but are not limited to, cyclopentanone, cyclohexanone, propylene glycol monomethyl ether, propylene glycol monomethyl ether acetate, gamma-butyrolactone, 3-methoxypropionate, dipropylene glycol dimethyl ether, 3-methoxybutyl acetate, anisole, mesitylene, 2-heptanone, cyrene, 2-butanone, ethyl lactate, amyl acetate, n-butyl acetate, n-methyl-2-pyrrolidone, N-butyl-2-pyrrolidone, and their combinations thereof.

A polymer can be formed from polymerizing the above-described polymerizable monomer(s) in the photosensitive composition and the formed polymer can then be cross-linked under radiation. The polymer can be formed in the presence of a radical initiator, or other photoactive compounds. In one embodiment, the polymerization process can be carried out at a temperature of 50-150° C. over a period of 5-50 hours.

The radical initiator is generally an azo compound or an organic peroxide. In one embodiment, the radical initiator is an oil soluble azo compound. Such initiators can include, for example, dimethyl 2,2'-azobis(2-methylpropionate) and 2,2'-azobis(2,4-dimethylvaleronitrile). The total initiator added can be in a range of 1-5 wt. %, based on the weight of the starting reaction mixture.

One or more additional inhibitors can be present in the photosensitive composition as described above. In some embodiments, the inhibitor is hindered phenols or piperdine-N-oxides. The inhibitors can be selected from the group consisting of ,6-di-t-butyl-4-methylphenol, 2,5-di-tert-butyl-1,4-benzohydroquinone, 2-t-butylhydroquinone, 2,3,5-trimethyl-1,4-hydroquinone, 4-methoxyphenol, 2,2,6,6-tetramethyl-1-piperidinyloxy, 4-hydroxy-2,2,6,6-tetramethyl-1-piperidinyloxy, dibenzo-1,4-thiazine, bis(2,4-di-tert-butylphenyl)pentaerythritol diphosphate, 4-methoxyphenol, 2,2,6,6-tetramethyl-1-piperidinyloxy, 4-hydroxy-2,2,6,6-tetramethyl-1-piperidinyloxy, dibenzo-1,4-thiazine, bis(2,4-di-tert-butylphenyl)pentaerythritol diphosphate, triethylene glycol bis[j-(5-tert-butyl-4-hydroxy-3-methylphenyl)propionate], and 2,6-di-tert-butyl-4-octadecylphenol, and combinations thereof.

Examples of the inhibitors can include, but are not limited to, the following chemical structures shown below:

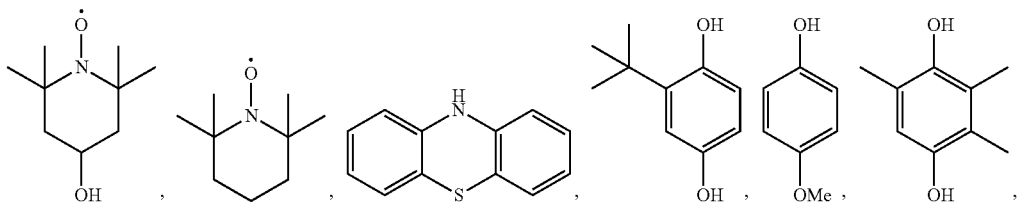

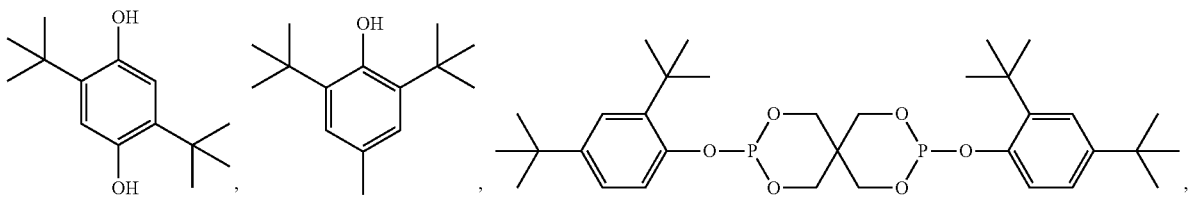

-continued

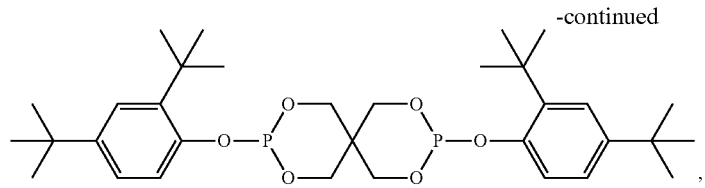

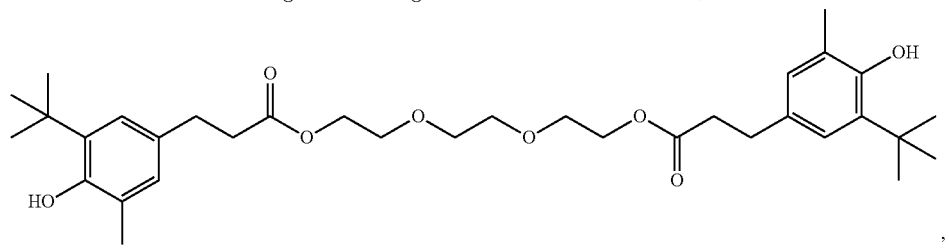

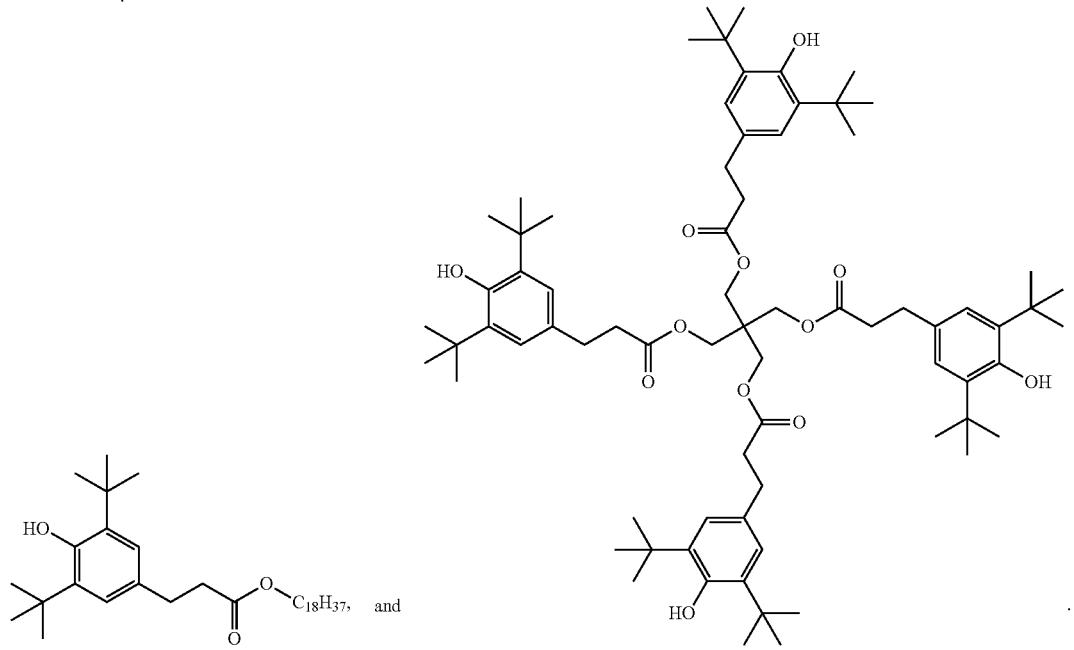

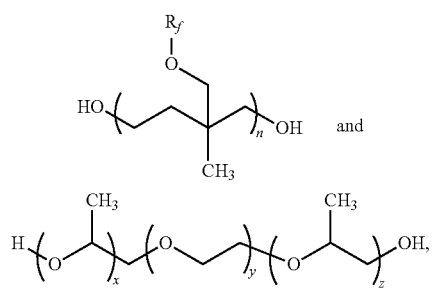

One or more non-ionic surfactants can be added into the photosensitive composition as described above. Examples of the non-ionic surfactants can include, but are not limited to, where R is $CH_2CF_3$ or $CH_2CF_2CF_3$, n is an integer of 3-20, x is an integer of 5-20, y is an integer of 10-30, and z is an integer of 5-20. Such surfactants may be present in an amount of from 0 to 40 g/L, or from 0 to 25 g/L.

The photosensitive composition as described above can further comprise at least one adhesion promoters. The adhesion promoters can be oxygen, sulfur or nitrogen functionalized silane coupling agents.

In one embodiment, the adhesion promoters can be selected from the group consisting of methacryloxy-3-propyltrialkoxysilane, 3-mercaptotrialkoxysilane, 4-vinylphenylethyltrialkoxysilane, phenyltrialkoxysilane, 4-vinylphenyltrialkoxysilane, vinyltrialkoxysilane, vinyltriacetoxysilane, N-2-[3-(trialkoxysilyl)propyl]-1,3,5-triazine-2,4,6-triamine, 3-ureidopropyl-trialkoxysilane, bis[3-(trialkoxysilyl)propyl] fumarate, N-[3-(trialkoxysilyl)propyl]maleamic acid, bis[3-(trialkoxysilyl)propyl] maleate, trialkoxysilylpropylsuccinic anhydride. The alkoxy can be methoxy, ethoxy, or isopropoxy. The adhesion promoters can also be one or more of aromatic heterocycles containing two or more nitrogen atoms such as imidazoles, benzotriazole, 5-methylbenzotriazole, 5-carboxybenzotriazole, 1,3,5-triazine-2,4,6-trithiol, 1,3,4-thiadiazole-2,5-dithiol, and combinations thereof.

Examples of the adhesion promoters can include, but not limited to, the following chemical structures shown below:

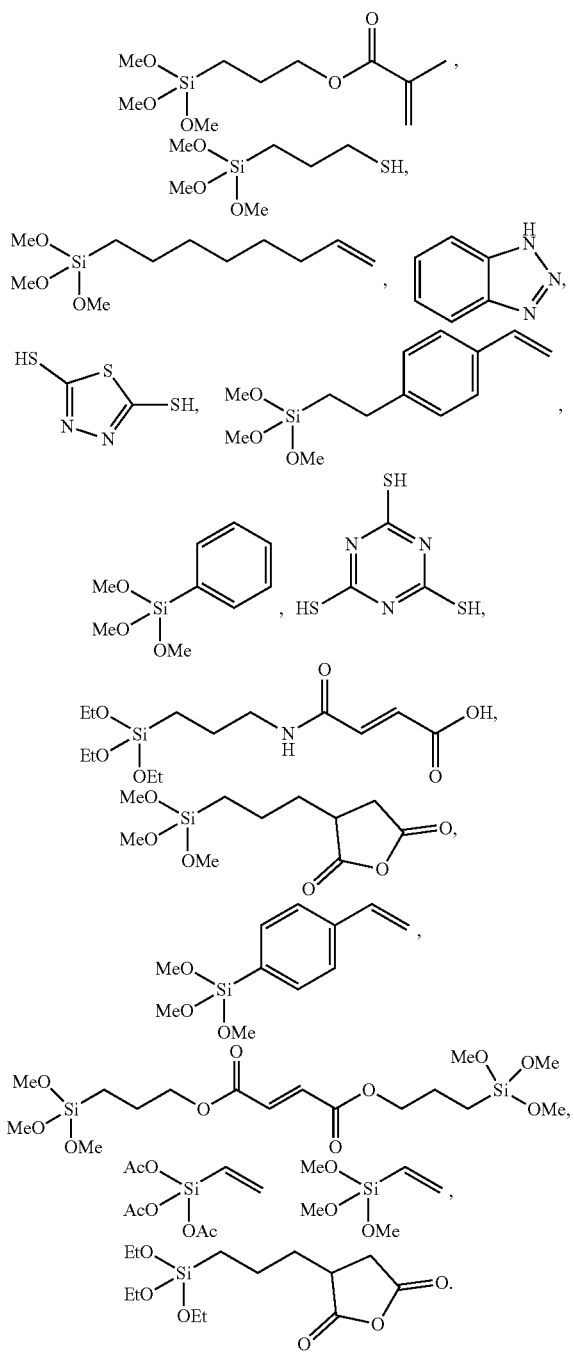

In addition, various vapor treatments known in the art may be used to increase the adhesion of the polymers of the present disclosure to the substrate surface, such as plasma treatments. In certain applications, it may be preferred to use an adhesion promoter o treat the substrate surface prior to coating the surface with the present compositions.

Suitable additives that may be useful in the photosensitive compositions of the present disclosure include, without limitation, one or more of inorganic fillers, organic fillers, plasticizers, metal passivating materials, and combinations of any of the foregoing. Any suitable inorganic fillers may optionally be used in the present compositions, and are well-known to those skilled in the art. Exemplary inorganic fillers include, but are not limited to, silica, silicon carbide, silicon nitride, alumina, aluminum carbide, aluminum nitride, zirconia, and the like, and mixtures thereof. The inorganic filler may be in the form of a powder, rods, spheres, or any other suitable shape. Such inorganic fillers may have any suitable dimensions. Such inorganic fillers may comprise a coupling agent, such as a silane or a titanate in conventional amounts.

Inorganic fillers may be used in an amount of from 0 to 80 wt. %, or from 40 to 80 wt. %, as solids based on the total weight of the composition. In some embodiments, no inorganic fillers are present.

In one embodiment, the metal passivating material is a copper passivating agent. Suitable copper passivating agents are well known in the art and include imidazoles, benzotriazoles, ethylene diamine or its salts or acid esters, and iminodiacetic acids or salts thereof.

The present disclosure is also directed to a photosensitive dielectric film. The photosensitive dielectric films can be prepared from the above-described photosensitive compositions. The photosensitive compositions can be applied or deposited on a surface of a substrate using any known techniques and apparatus. The composition can be applied as a substantially continuous film or in a discontinuous pattern and heated to remove solvent. The thickness of the deposited composition can vary, depending upon the desired thickness of the resultant cured product. The compositions of the present disclosure can be used to form a layer or film suitable for use as dielectric layers, permanent bonding adhesives, as stress buffer layers, and the like. The dielectric film formed on the substrate can be used directly, or can be peeled off and used on different substrates in electronic devices.

Any substrate known in the art can be used in the present disclosure. Examples of the substrate can include, but are not limited to, silicon, copper, silver, indium tin oxide, silicon dioxide, glass, silico nitride, aluminum, gold, polyimide and epoxy mold compound.

The photosensitive compositions of the present disclosure may be deposited or coated on a substrate by any suitable method. Suitable methods for disposing the present compositions include, but are not limited to, spin-coating, curtain coating, spray coating, roller coating, dip coating, vapor deposition, and lamination such as vacuum lamination, among other methods. In the semiconductor manufacturing industry, spin-coating is a preferred method to take advantage of existing equipment and processes. In spin-coating, the solids content of the composition may be adjusted, along with the spin speed, to achieve a desired thickness of the composition on the surface it is applied to. The substrate deposited or coated can be cured under suitable radiation to form a photosensitive dielectric film of the present disclosure. This can be followed by an additional heating step to further cure the film if needed.

The radiation can extend in general from 150 nm to 600 nm, or from 190 nm to 600 nm, (UV to visible light ranges). Suitable radiation is present, for example, in Sunlight or light from artificial light sources. Light sources are not particularly limited and may be appropriately selected depending on the purpose. Both point Sources and arrays ("lamp carpets") are suitable. Examples thereof include carbon arc lamps, Xenon arc lamps, low medium-, high- and Superhigh-pressure mercury lamps, possibly with metal halide dopes (metal-halogen lamps), micro wave-stimulated metal vapor lamps, excimer lamps, Super actinic fluorescent tubes, fluorescent lamps, argon incandescent lamps, electronic flashlights, photographic flood lamps, light emitting diodes (LED), electron beams and X-rays. The distance between the lamp and the base material including the photosensitive composition of the present disclosure to be exposed may vary depending on the intended application and the type and output of lamp, and may be, for example, from 20 μm to 150 cm. Laser light sources, for example excimer lasers, such as F excimer lasers at 157 mm exposure, KrF excimer lasers for exposure at 248 nm and ArF excimer lasers for exposure at 193 nm are also suitable. Lasers in the visible region can also be employed. Optionally other features of resolution enhancement, such as a lens, may be used. Where a lens is used, a numerical aperture from 0.05 to 0.6 or from 0.1 to 0.3 may be used.

In the photosensitive dielectric film of the present embodiment, the minimum light transmittance in a wave length band of 248 nm to 436 nm of the photosensitive resin layer can be 80% or more, or 85% or more, when the total film thickness of both of the layers is set at 1 to 80 μm.

In one embodiment, a photosensitive composition described herein can be spin cast onto a desirable substrate. The composition can be cast via a slot die coater or other suitable apparatus to form a dry film desirable for electronic applications. The cast films can be soft baked to remove residual solvent for 30 seconds to 10 minutes at temperatures of 70-150° C., or of 90-120° C.

The soft baked film can then be subjected to a curing condition under radiation as described above. The film can further be cured at 150-250° C. for 30 minutes to 4 hours if needed. The resulting cured film has good tensile strength, tensile elongation, good adhesion to desired substrates such as copper and a silicon wafer, and low dielectric loss at high frequency. The photosensitive composition disclosed herein can achieve these good properties without the aid of any kind of inorganic filler.

In another embodiment, layers of the photosensitive compositions of the present disclosure may also be formed as a dry film and disposed on the surface of a substrate by lamination. A variety of suitable lamination techniques, including vacuum lamination techniques, may be used and are well known to those skilled in the art. In forming a dry film, the present compositions are first disposed, such as coated, onto a front surface of a suitable film support sheet such as a polyester sheet, preferably polyethylene terephthalate (PET) sheet, or a polyimide sheet such as KAPTON™ polyimide (DuPont, Wilmington, Del.), using slot-die coating, gravure printing, or another appropriate method. The composition is then soft baked at a suitable temperature, such as from 90 to 140° C., for an appropriate time, such as from 1 to 30 minutes, to remove any solvent. A polymer film cover sheet such as polyethylene is then roll-laminated at room temperature (20-25° C.) onto the dried composition to protect the composition during storage and handling. To dispose the dried composition onto the substrate, the cover sheet is first removed. Then, the dried composition on the support sheet is laminated onto the substrate surface using roll-lamination or vacuum lamination. The lamination temperature can range from 20 to 120° C. The support sheet is then removed (peeled), leaving the dried composition on that surface.

The photosensitive compositions described herein can be used to form dielectric films with Dk values less than 2.5, or less than 2.4 and Df values less than 0.006, or less than 0.005, or less than 0.004, or less than 0.0035 at high frequencies (20 to 40 GHz). In one embodiment, the dielectric films have a Dk≤2.5, or ≤2.4 and a Df≤0.004, or ≤0.035 at a frequency of 20 GHz. In another embodiment, the dielectric films have a Dk≤2.35 and a Df≤0.004 at a frequency of 30 GHz. In yet another embodiment, the dielectric films have a Dk≤2.35 and a Df≤0.006 at a frequency of 40 GHz.

The present disclosure is also directed to a wide variety of electronic devices comprising at least one layer of the dielectric film of the present application on an electric substrate. A wide variety of electronic device substrates may be employed in the present disclosure. An electronic device substrate is any substrate for use in the manufacture of any electronic device. Exemplary electronic device substrates include, without limitation, semiconductor wafers, glass, sapphire, silicate materials, silicon nitride materials, silicon carbide materials, display device substrates, epoxy mold compound wafers, circuit board substrates, and thermally stable polymers. As used herein, the term "semiconductor wafer" is intended to encompass a semiconductor substrate, a semiconductor device, and various packages for various levels of interconnection, including a single-chip wafer, multiple-chip wafer, packages for various levels, substrates for light emitting diodes (LEDs), or other assemblies requiring solder connections. Semiconductor wafers, such as silicon wafers, gallium-arsenide wafers, and silicon-germanium wafers, may be patterned or unpatterned. As used herein, the term "semiconductor substrate" includes any substrate having one or more semiconductor layers or structures which include active or operable portions of semiconductor devices. The term "semiconductor substrate" is defined to mean any construction comprising semiconductive material, such as a semiconductor device. A semiconductor device refers to a semiconductor substrate upon which at least one microelectronic device has been or is being fabricated. Thermally stable polymers include, without limitation, any polymer stable to the temperatures used to cure the arylcyclobutene material, such as polyimide, for example, KAPTON™ polyimide (DuPont, Wilmington, Del.), liquid crystalline polymers, for example VECSTAR™ LCP film (Kuraray, Tokyo, Japan) and Bismaleimide-Triazine (BT) resins (MGC, Tokyo, Japan).

The present disclosure is also directed to a presensitized lithographic printing plate comprising a hydrophilic support and an image-forming layer comprising the photosensitive composition and a lithographic process for making the presensitized lithographic printing plate. The lithographic process comprises steps of: (a) image-wise heating a pre-sensitized lithographic printing plate comprising a hydrophilic support and an image-forming layer comprising the photosensitive composition; (b) exposing the plate to ultra-violet (UV) light; and (c) dissolving and remove a non-imaging area with a solution. The photosensitive composition is the same as those described previously.

The hydrophilic support can be made of metal, plastic or paper. The support can be a surface-treated aluminum plate, a hydrophilic treated plastic film or a water-proofed paper. Specifically, the support can be an aluminum plate subjected to anodic oxidation, a polyethylene terephthalate film provided with a hydrophilic layer or a paper laminated with a polyethylene film.

In one embodiment, the aluminum plate subjected to anodic oxidation can be used. The aluminum plate can be a plate of pure aluminum, or an alloy plate comprising the main component of aluminum and a little amount of other metals. Examples of the metals other than aluminum include Si, Fe, Mn, Co, Mg, Cr, Zn, Bi, Ni and Ti. The amount of the other metals can be 10 wt % or less. The aluminum plate has a thickness in the range of 0.05 to 0.6 mm, or 0.1 to 0.4 mm, or 0.15 to 0.3 mm.

The surface of the aluminum plate can be subjected to a roughing treatment. The roughing treatment can be mechanically, electrochemically or chemically conducted. Examples of the mechanical roughing treatments include a ball grinding treatment, a brush grinding treatment, a blast grinding treatment and a buff grinding treatment. The electrochemical roughing treatment can be conducted by a process, in which a direct or alternative current is applied to the plate in an electrolysis solution containing an acid such as hydrochloric acid or nitric acid. The electrolytic roughing treatment can be conducted in a mixture of two or more acids. The chemical roughing treatment can be conducted by a process, in which the aluminum plate is immersed in a saturated aqueous solution of aluminum salt with mineral acid. After the roughing treatment, the aluminum plate can have a surface roughness of Ra (average along the central line) in a range of 0.2 to 1.0 μm.

After the roughing treatment, the aluminum plate can be subjected to an alkali etching treatment. The alkali etching solution can be an aqueous solution of potassium hydroxide or sodium hydroxide. A neutralizing treatment can be conducted after the alkali etching treatment.

The aluminum plate can then be subjected to an anodic oxidation treatment to improve an abrasion resistance of the support. The anodic oxidation treatment can use various electrolytes to form a porous oxide film. Examples of the electrolytes include sulfuric acid, hydrochloric acid, oxalic acid, chromic acid, and mixtures thereof.

The anodic oxidation treatment is generally conducted under the conditions that the concentration of the electrolytic solution is in a range of 1 to 80 wt. %, the temperature of the solution is in a range of 5 to 70° C., the electric current density is in a range of 5 to 60 A/dm$^2$, the voltage is in a range of 1 to 100 V and the time for electrolysis is in a range of 10 seconds to 5 minutes. The oxide film formed by the anodic oxidation has a thickness in a range of 1.0 to 5.0 g/m$^2$, or 1.5 to 4.0 g/m$^2$.

In addition, a water-soluble overcoating layer can be provided on the image-forming layer to protect the surface of the image-forming layer from stain caused by an oleophilic substance. The water-soluble overcoating layer is made of a substance that can easily be removed in printing, for example, a water-soluble organic polymer. Examples of the water-soluble organic polymers can include, but are not limited to, polyvinyl alcohol, polyvinyl acetate, polyacrylic acid, salts thereof with alkali metals and amines, polymethacrylic acid, salts thereof with alkali metals and amines, polyacrylamide, polyhydroxyethyl acrylate, polyvinyl pyrrolidone, polyvinyl methyl ether, poly-2-acrylamice-2-methyl-1-propanesulfonic acid, salts thereof with alkali metals and amines, gum arabic, cellulose ethers (e.g., carboxymethyl cellulose, carboxyethyl cellulose, methyl cellulose), dextrin and derivatives thereof (e.g., white dextrin, dextrin decomposed with enzyme, etherized dextrin, pullulan).

The water-soluble organic polymer can be a copolymer. Examples of the copolymers can include, but are not limited to, vinyl alcohol-vinyl acetate copolymer (partially saponified polyvinyl acetate) and vinyl methyl ether-maleic anhydride copolymer. In the case where the vinyl alcohol-vinyl acetate copolymer is prepared by partially saponifying polyvinyl acetate, the saponification degree can be 65% or more. Two or more water-soluble organic polymers can be used in combination. The amount of the water-soluble overcoating layer can be in a range of 0.1 to 2.0 g/m$^2$.

The presensitized lithographic printing plate can be imagewise heated to form an image. In one embodiment, the presensitized plate can be image-wise heated with a thermal recording head. The image formation using the thermal head does not require an agent capable of converting light to light. The agent capable of converting light to heat can be used, since the thermal recording head generally gives an image with low resolution. An imagewise exposure of light generally gives an image of higher resolution.

The presensitized plate can be imagewise exposed to light through an original image (analog data). The presensitized plate can also be scanned with light corresponding to original image data (usually, digital data). In the analog exposure, the light source can be a xenon discharge lamp or an infrared lamp. A flash exposure can be conducted for a short time, where a high-power lamp such as a xenon lamp is used as the light source.

In the latter scanning exposure, a laser, particularly an infrared laser, can generally be used. The infrared laser can emits rays in the wavelength region of 700 to 1,200 nm. The laser can be a high power solid infrared laser (e.g., semi-conductor laser, YAG laser).

When the image-forming layer containing an agent capable of converting light to beat is exposed to the scanning laser beam, the light energy of the beam is converted into thermal energy. The photosensitive composition of the present disclosure thereof in the heated area (imaging area) of the presensitized plate is polymerized and/or cross-linked to harden the heated area. If the compound or polymer is contained in particles, the particles in the heated area are melted and fused to form a hydrophobic area on the hydrophilic support. On the other hand, the compound or polymer in the unheated area (non-imaging area) is not changed in the plate. Heating step can also be added between the step (b) and (c) in the lithographic process described above.

In the case where particles are not used in the image-forming layer (where the image-forming layer is homogeneous), acidic groups can be introduced into a polymer in the image-forming layer to remove the unheated area (non-imaging area) by washed the plate with an alkali developing solution.

In the case where particles are contained-in the image-forming layer, the particles in the unheated area (non-imaging area) can be removed with water or an aqueous solution. The step of removing the particles (developing step) can be replaced with a press development. In the press development, the imagewise heated plate is installed in a printer, and subjected to usual printing treatments. The plate can be developed with the printing treatments using dampening water and ink, and successively a priming process is conducted by using the plate, the dampening water and the ink. The unheated area (non-imaging area) of the image-forming layer is removed with dampening water, ink or rubbing force of printing treatment, when the printer is worked.

In one embodiment, the lithographic process can comprise steps of: (a) installing a presensitized lithographic plate comprising a hydrophilic support and an image-forming layer comprising the photosensitive composition of the present disclosure on a cylinder of a printer, (b) exposing the plate to a laser (emitted from a light source is attached to the printer), and subjecting the plate to press development with dampening water and ink. A printer equipped with a laser-exposing apparatus can be used to conduct the steps of exposure to printing successively.

After the development, the printing plate can be heated to cause a reaction of an un-reacted compound or polymer (which remains in the imaging area) to further improve the endurance (plate wear) of the printing plate.

EXAMPLES

The concepts described herein will be further illustrated in the following examples, which do not limit the scope of the present disclosure described in the claims.

Materials:

Beta-myrcene was purchased from Vigon International Inc. Styrene was purchased from Sigma-Aldrich Corporation. Vinyl toluene was received from Deltech Corporation. Vazo 65 Azo Initiator (V-65) and V-601 were purchased from FUJIFILM Wako Chemicals U.S.A. Corporation. 4-vinyl pyridine was obtained from Vertellus and used as received. Polyfox PF656 was received from Omnova Solutions. 7-Octenyl trimethoxy silane (KBM-1083) and bifunctional amino siloxane (PAM-E) were received from Shin-Etsu Chemical Company. Bismaleimides BMI-689 and BMI-1400 were received from Designer Molecules. 4-Hydroxy TEMPO, Irgacure OXE01 (OXE01) and Irgacure OXE02 (OXE02) were from BASF and used as received. Omnirad 819 was received from IGM Resin. Bismaleimides BMI-4000, BMI-TMH and BMI-5100 were received from Daiwa Kasei. 3a,4,7,7a-Tetrahydro-4,7-epoxyisobenzofuran-1,3-dione was received from Oakwood Chemical. 1-(4-Vinylphenoxy benzocyclobutene (BCB) was prepared according to U.S. Pat. Application No 20190169327A1, the entire contents of which are incorporated herein by reference. All other solvents and chemicals were received from the Dow Chemical Company and used as received without additional purification.

Compound Synthesis

Example 1—S1

To a 250 ml round bottom flask equipped with a stir bar and a reflux condenser under a nitrogen blanket, 10 g of PAM-E was added and dissolved in 114 g of tetrahydrofuran. When dissolution was complete, 3a,4,7,7a-tetrahydro-4,7-epoxyisobenzofuran-1,3-dione (12.78 g) was added as a solid and the solution was brought to reflux for ten hours. Subsequently the solution was cooled down to about 25° C. and the tetrahydrofuran was removed via rotary evaporation. 114 g of toluene was added. The solution was brought to reflux once more for 6 hours, and then toluene was removed via distillation. 14.77 g of the light yellow slightly viscous liquid of containing 94% of the desired product was obtained.

Example 2—S2

The following monomers and solvent were added to a 5 L jacketed reactor with overhead stirring and heated to 80° C. under a nitrogen blanket: 1044.59 g 1-(4-vinylphenoxy) benzocyclobutene, 778.34 g vinyl toluene, 80.18 g 4-vinyl pyridine, 447.67 g beta-myrcene and 997.04 g cyclohexanone. An initiator feed of 71.67 g V-65 and 888.21 g cyclohexanone was added at a constant rate into the reactor for 20 hours, and temperature was held at 80° C. for an additional 2 hours before decreased to 25° C. The solution was used directly for preparing the following polymerizable formulation.

Example 3—S3

An identical procedure to Example 2 was used instead in a 100 ml EasyMax™ Reactor and the following amounts of materials were used: 11.77 g 1-(4-vinylphenoxy)benzocyclobutene, 8.83 g vinyl toluene, 0.6 g vinyl pyridine, 6.33 g beta-myrcene and 11.79 g anisole. A shot initiator feed of 0.41 g V-601 was added into the reactor and reacted for 15 hours, and then a feed of 0.41 g V-65 in 10.71 g anisole was fed at a constant rate into the reactor for an additional 15 hours, and temperature was held at 80° C. for an additional 2 hours before decreased to 25° C. The solution was used directly for preparing the following polymerizable formulation.

Polymerizable Formulation

Example 4

To a 20 ml glass vial, S3 prepared from Example 3 was added to make up 75.1% of solids content by weight; BMI-689 was added to equal 20% of solids by weight; OXE01 was added to make up 2.5% of solids by weight; and a blend of 2 parts 7-octenyltrimethoxysilane (KBM-1083), 0.2 parts 4-Hydroxy TEMPO, and 0.2 parts Polyfox PF-656 was added so as to make up 2.4% of solids by weight. Cyclopentanone was then added so as to make the entire solution 51% solids content and had a total mass of 15 grams. The vial was sealed and rolled overnight to homogenize. The contents of the vial were then filtered through a 5-micron Nylon™ filter. The solution was allowed to degas for 3 hours at ambient conditions before coating.

Example 5

Formulation was prepared in the same manner as Example 4, excepting that S3 was replaced by S2 prepared from Example 2.

Example 6

Formulation was prepared in the same manner as Example 4, excepting that S3 was replaced by S2 prepared from Example 2 that was used to make up 70.1% of solids, and BMI-689 was used to make up 25% of solids.

Example 7

Formulation was prepared in the same manner as Example 4, excepting that S3 was replaced by S2 prepared from Example 2 that was used to make up 80.1% of solids, and BMI-689 was used to make up 15% of solids.

Example 8

Formulation was prepared in the same manner as Example 4, excepting that S3 was replaced by S2 prepared from Example 2 and OXE01 was replaced by OXE02.

Example 9

Formulation was prepared in the same manner as Example 4, excepting that S3 was replaced by S2 prepared from Example 2 and BMI-689 was replaced by BMI-1400.

Example 10

Formulation was prepared in the same manner as Example 4, excepting that S3 was replaced by S2 prepared from Example 2 and BMI-698 was replaced by BMI-TMH.

Example 11

Formulation was prepared in the same manner as Example 4, excepting that S3 was replaced by S2 prepared from Example 2 and BMI-689 was replaced by S1 prepared from Example 1.

Example 12

Formulation was prepared in the same manner as Example 4, excepting that BMI-689 was used so as to make up 92.6% of solids by weight and S3 was removed.

Comparative Example 1

Formulation was prepared in the same manner as Example 4, excepting that S3 was replaced by S2 prepared from Example 2, and OXE01 was replaced by Omnirad 819.

Comparative Example 2

Formulation was prepared in the same manner as Example 4, excepting that S3 was used to make up 77.6% of solids by weight, and OXE01 was removed.

Comparative Example 3

Formulation was prepared in the same manner as Example 4, excepting that S3 was replaced by S2 prepared from Example 2, and BMI-689 was replaced by BMI-5100.

Comparative Example 4

Formulation was prepared in the same manner as Example 4, excepting that S3 was replaced by S2 prepared from Example 2, and BMI-689 was replaced by BMI-4000.

Polymer Film Preparation

Polymer formulations were deposited via spin coating onto silicon substrates for lithographic evaluation or copper wafer substrates to obtain free standing films for analysis, 200 mm in diameter and soft baked at 120° C. for 3 minutes.

In order to determine the distance of irradiation from the film and the overall energy supplied a Karl Suss Mask Aligner was used. An exposure and alignment gap of 20 µm was used. The mask aligner used a broadband UV light source during which the power was measured to be 30 W. A time of 20 seconds was used to supply the film with 600 mj/cm$^2$ of light energy. The film was exposed through a multi-transmission mask that allowed variable light intensity through to determine the photospeed.

The films were post-exposure baked at 65° C. for 90 seconds. The films were subjected to a puddle development of two by thirty seconds in propylene glycol methyl ether acetate (PGMEA), then spun dry, rinsed with PGMEA and a post development bake of 120° C. for 1 minute was used.

For freestanding film samples, polymer films were then cured in a Blue M oven at 200° C. for one hour under nitrogen, less than 100 ppm of oxygen. The resulting substrate was cleaved into suitable sizes and films were lifted in a 5% ammonium sulfate in water bath, rinsed and dried to obtain free standing films for analysis. Film thickness was measured using an optical Filmetrics F50 and corresponding software tool.

Characterization of Polymer Film
Test Methods
(1) Dielectric Properties:

The IPC test method TM-650 2.5.5.1 was used to determine dielectric properties of free-standing films using a copper split cylinder resonator machined such that they possessed having empty cavity frequencies of 20, 30 and 40 GHz each and a Keysight N5224A PNA network analyzer.

The film geometry was such that the substrate extends beyond the diameter of the two cylindrical cavity sections. Although the dielectric substrate thickness can vary from 0.05 mm to 5.0 mm. A substrate thickness of 0.02 mm was used.

Free-standing films were placed in the cavity of the split cylinder resonator and the resonant frequency and quality factor of the $TE_{011}$ resonant mode were measured using the network analyzer. Relative permittivity (Dk) and loss tangent (Df) of the films were calculated from the $TE_{011}$ resonant mode using software provided by Keysight.

(2) Lithographic Data

Film thickness loss after development was measured with a Filmetrics F50 tool as described above. The energy to gel point (Egel) was determined when film thickness was greater than or equal to eight percent of film thickness at the full twenty seconds of exposure (358 millijoules per centimeter squared in this case), in terms of energy. The resolution was determined by optical inspection of circular sized vias that were found to be resolved via optical microscope.

(3) Dynamic Mechanical Analysis

Free standing films were cleaved into 10 mm by 25 mm geometry and placed in a TA Instruments dynamic mechanical analyzer Q800 instrument at a strain rate of 0.06%, preload force of 1 newton and a frequency of 1 hertz. The temperature was equilibrated at 50° C. then increased to 200° C. at a rate of 5° C. per minute. The glass transition temperature value was taken as the maximum value of the curve of tan δ.

Test Results

In Comparative Examples 1-4, material property data such as Dk, Df and Tg could not be obtained since the material failed to UV cure and dissolved away completely in the developer, leaving clean substrates and no film was formed from the liquid formulations.

Table 1 lists the test results from Examples 4-12.

Note that not all of the activities described above in the general description or the examples are required, that a portion of a specific activity may not be required, and that one or more further activities may be performed in addition to those described. Still further, the order in which activities are listed are not necessarily the order in which they are performed.

TABLE 1

| | | | | | | Film Properties | | | | | | |
|---|---|---|---|---|---|---|---|---|---|---|---|---|
| Ex. | Thickness µm | Thickness Loss µm | Egel mj/cm$^2$ | Resolution µm | Dk 20 GHz | Df 20 GHz | Dk 20 GHz | Df 20 GHz | Dk 20 GHz | Df 20 GHz | Tg DMA |
| 4 | 18.92 | 3.19 | 63 | 15 | 2.29 | 0.0022 | 2.2 | 0.0027 | 2.21 | 0.004 | 175 |
| 5 | 18.85 | 3.76 | 72 | 15 | 2.29 | 0.0022 | 2.22 | 0.0027 | 2.23 | 0.004 | 174 |

TABLE 1-continued

| | | Thickness | | | Film Properties | | | | | | |
| | Thickness | Loss | Egel | Resolution | Dk 20 | Df 20 | Dk 20 | Df 20 | Dk 20 | Df 20 | Tg |
| Ex. | μm | μm | mj/cm$^2$ | μm | GHz | GHz | GHz | GHz | GHz | GHz | DMA |
|---|---|---|---|---|---|---|---|---|---|---|---|
| 6 | 16.66 | 3.05 | 67 | 15 | 2.31 | 0.0021 | 2.24 | 0.0023 | 2.25 | 0.0035 | 165 |
| 7 | 19.25 | 4.86 | 103 | 15 | 2.32 | 0.002 | 2.26 | 0.0025 | 2.24 | 0.0038 | 174 |
| 8 | 18.38 | 2 | 42 | 20 | 2.38 | 0.0024 | 2.3 | 0.0031 | 2.3 | 0.0043 | 181 |
| 9 | 19.98 | 5.4 | 116 | 40 | 2.37 | 0.0019 | 2.3 | 0.0023 | 2.29 | 0.0034 | 163 |
| 10 | 18.14 | 3.74 | 192 | 15 | 2.4 | 0.0035 | 2.31 | 0.0039 | 2.33 | 0.006 | 184 |
| 11 | 18.97 | 6.44 | 112 | 40 | 2.39 | 0.0034 | 2.33 | 0.0035 | 2.33 | 0.0053 | 185 |
| 12 | 11.12 | 1.83 | 20 | 12 | 2.14 | 0.0022 | 2.05 | 0.0025 | 2.07 | 0.0026 | 69 |

What is claimed is:

1. A photosensitive composition comprising a photoinitiator, a bismaleimide component, a polymerizable arylcyclobutene monomer, and at least one polymerizable nitrogen heterocycle containing monomer; wherein the photoinitiator is an oxime ester compound present from 0.5 to 25 percent by weight based on the weight of the bismaleimide component;

wherein the bismaleimide component comprises a bismaleimide compound or a bismaleimide oligomer;

wherein the bismaleimide compound is represented by a general formula (I):

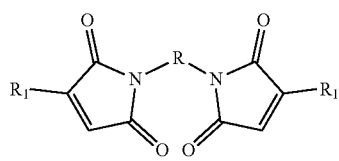

(I)

where R is substituted or unsubstituted linking group selected from the group consisting of alkylene, alkylenearyl, cycloalkylene, cycloalkylenearyl, cycloalkylalkylene and combinations thereof; and $R_1$ is selected from the group consisting of hydrogen, deuterium, halogen, cyano, methyl, vinyl, allyl, isoprene, and combinations thereof;

wherein the bismaleimide oligomer is represented by a general Formula (II):

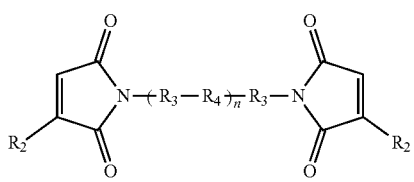

(II)

where $R_2$ is H or $CH_3$; $R_3$ is $C_1$-$C_{40}$ alkyl, alkyl polydimethyl siloxane, or alkylaryl; $R_4$ is selected from the group consisting of

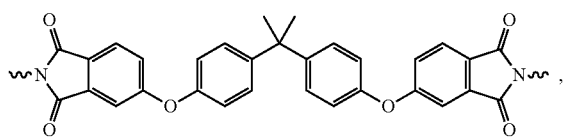

-continued

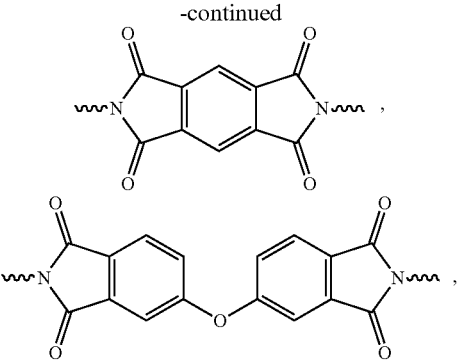

and combinations thereof; and n is an integer of 1 to 10; and wherein the arylcyclobutene monomer is represented by a general Formula (IV), (V), or (VI),

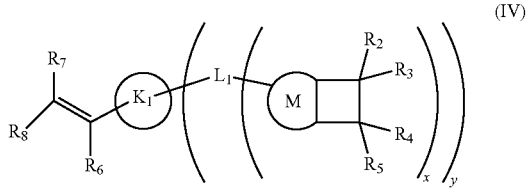

(IV)

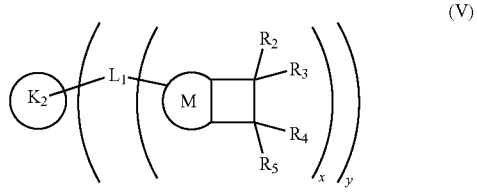

(V)

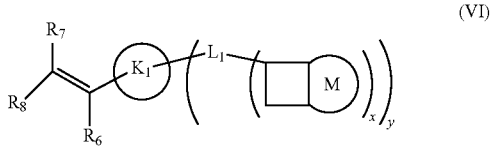

(VI)

where:

$K_1$ is a divalent group selected from the group consisting of alkyl, aryl, carbocyclic aryl polycyclic aryl, heteroaryl, aryloxy, arylalkyl, carbonyl, ester, carboxyl, ether, thioester, thioether, and a tertiary amine;

$L_1$ is a covalent bond or a multivalent linking group;

M is a substituted or unsubstituted divalent aromatic or polyaromatic radical group, or a substituted or unsubstituted divalent heteroaromatic radical group;

$R_2$-$R_5$ are identical or different and each is independently selected from the group consisting of unsubstituted or substituted alkyl, unsubstituted or substituted alkyloxy, unsubstituted or substituted aryl, unsubstituted or substituted aryloxy, alkylthio, arylthiol, substituted alkyl amino, and substituted aryl amino;

$R_6$-$R_8$ are identical or different and each is independently selected from the group consisting of hydrogen, deuterium, cyano, halo, methyl, vinyl, allyl, and isoprene;

$K_2$ is a polymerizable functional group; and x and y are the same or different and are an integer from 1-5, wherein when $L_1$ is a covalent bond, y=1.

2. The photosensitive composition of claim 1, wherein the photoinitiator is selected from the group consisting of

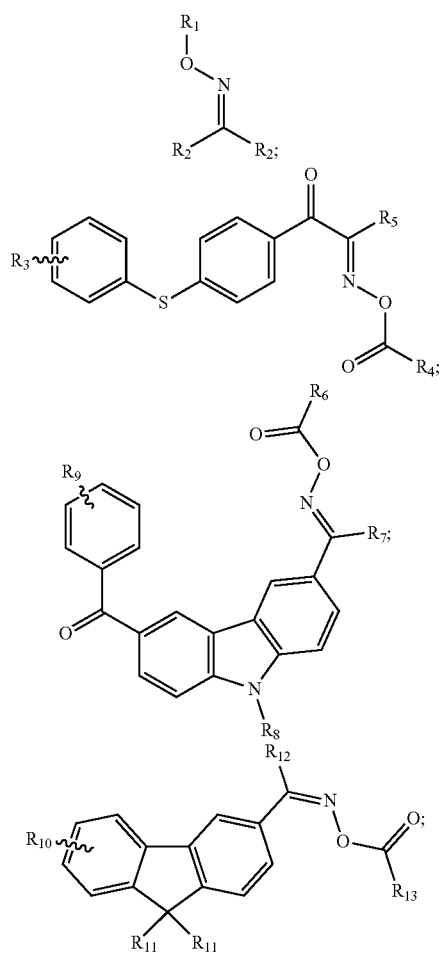

and combinations thereof, where $R_1$ is $CO_2Ph$, $CO_2Me$ or $CO_2Et$; $R_2$ is ketone, aryl, aryl ether, sulfide aryl ether or alkyl; $R_3$ is H, OH, COOH, methyl; each of $R_4$ and $R_5$ is independently an alkyl group having 1-10 carbon atoms, a cycloalkyl group or a phenyl group; each of $R_6$ and $R_7$ is independently an alkyl group having 1-10 carbon atoms, a cycloalkyl group or a phenyl group; $R_8$ is an alkyl group having 1 to 5 carbon atoms; $R_9$ is H, methyl or acetyl; $R_{10}$ is $NO_2$ or ArCO; $R_{11}$ is an alkyl group of 1 to 6 carbon atoms; and each of $R_{12}$ and $R_{13}$ is independently an alkyl group having 1-10 carbon atoms, a cycloalkyl group or a phenyl group.

3. A photosensitive composition comprising a photoinitiator, a bismaleimide component, and a thermosetting polymer; wherein the photoinitiator is an oxime ester compound present from 0.5 to 25 percent by weight based on the weight of the bismaleimide component, and wherein the thermosetting polymer is represented by a general Formula (III):

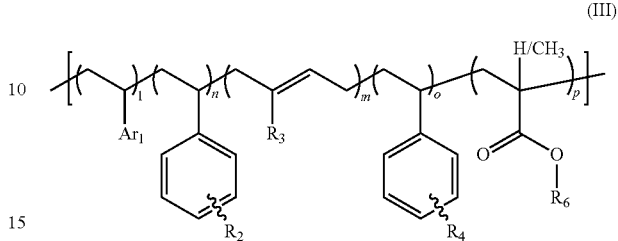

where $Ar_1$ is heterocycle containing an N, S, O or P atom; $R_2$ is H, $CH_3$, ethyl or t-butyl; $R_3$ is H, $CH_3$, $C_1$-$C_{12}$ alkyl or $C_1$-$C_{12}$ alkene; $R_4$ is cyclobutene, 1-oxy-cyclobutebe, α-methyl cyclobutene; l is an integer of 0 to 10; $R_6$ is an alkyl group of 1 to 12 carbon atoms, a cycloalkyl group, or an aryl group; n is an integer of 5 to 70; m is an integer of 5 to 50; and o is an integer of 5 to 50; and p is an integer of 5 to 50, wherein l+n+m+o+p=100;

wherein the bismaleimide component comprises a bismaleimide compound or a bismaleimide oligomer.

4. The photosensitive composition of claim 1, wherein the polymerizable arylcyclobutene monomer is selected from the group consisting of 1-(4-vinyl phenoxy)-benzocyclobutene, 1-(4-vinyl methoxy)-benzocyclobutene, 1-(4-vinyl phenyl)-benzocyclobutene, 1-(4-vinyl hydroxynaphthyl)-benzocyclobutene, 4-vinyl-1-methyl-benzocyclobutene, 4-vinyl-1-methoxy-benzocyclobutene, and 4-vinyl-1-phenoxy-benzocyclobutene.

5. The photosensitive composition of claim 1, further comprising at least one polymerizable dienophile monomer.

6. The photosensitive composition of claim 5, wherein the polymerizable dienophile monomer is represented by a general Formula (VII),

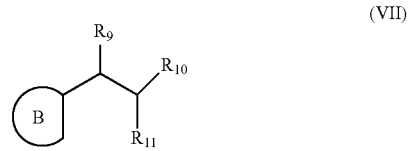

where B is hydrogen, substituted or unsubstituted alkyl, substituted or unsubstituted aromatic moiety or substituted or unsubstituted heteroaromatic moiety, hydroxy or substituted or unsubstituted alkyloxy, and $R_9$-$R_{11}$ are identical or different and each independently is selected from the group consisting of hydrogen, methyl, vinyl, allyl, isoprene, a substituted or unsubstituted alkyl group having 1 to 100 carbon atoms, a halogen, a cyano, a substituted or unsubstituted aryl group having 6 to 100 carbon atoms, a substituted or unsubstituted heteroaryl group having 6 to 100 carbon atoms, and combinations thereof.

7. The photosensitive composition of claim 5, further comprising at least one polymerizable diene monomer.

8. The photosensitive composition of claim 7, wherein the polymerizable diene monomer is presented by a general Formula (VIII),

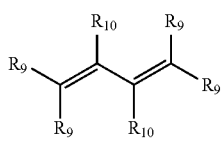
(VIII)

where $R^9$ is the same or different at each occurrence and is selected from hydrogen and methyl; and $R^{10}$ is the same or different at each occurrence and is selected from hydrogen, $C_{1-5}$ alkyl, $C_{1-5}$ alkoxy, $C_{1-5}$ thioalkyl, and $C_{5-12}$ alkenyl.

9. The photosensitive composition of claim 1, further comprising an inhibitor.

10. The photosensitive composition of claim 9, wherein the inhibitor is selected from the group consisting of 2,6-di-t-butyl-4-methylphenol, 2,5-di-tert-butyl-1,4-benzohydroquinone, 2-t-butylhydroquinone, 2,3,5-trimethyl-1,4-hydroquinone, 4-methoxyphenol, 2,2,6,6-tetramethyl-1-piperidinyloxy, 4-hydroxy-2,2,6,6-tetramethyl-1-piperidinyloxy, dibenzo-1,4-thiazine, bis(2,4-di-tert-butylphenyl)pentaerythritol diphosphate, triethylene glycol bis[β-(5-tert-butyl-4-hydroxy-3-methylphenyl)propionate], and 2,6-di-tert-butyl-4-octadecylphenol, and combinations thereof.

11. A lithographic process comprising steps of:
   (a) image-wise heating a presensitized lithographic printing plate comprising a hydrophilic support and an image-forming layer comprising the photosensitive composition of claim 1;
   (b) exposing the plate to UV light; and
   (c) dissolving and remove a non-imaging area with a solution.

12. The lithographic process of claim 11, further comprising a step (b1) of heating the plate between the step (b) and (c).

13. The lithographic process of claim 12, further comprising a step (d) of removing the unheated area of the image-forming layer.

14. The photosensitive composition of claim 1, wherein the polymerizable nitrogen heterocycle containing monomer comprises a nitrogen heterocycle selected from the group consisting of pyrrole, pyridine, diazines, triazines, imidazoles, benzoimidazoles, and quinolones.

15. The photosensitive composition of claim 3, wherein the photoinitiator is selected from the group consisting of

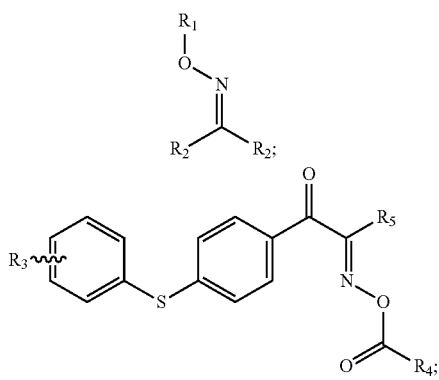

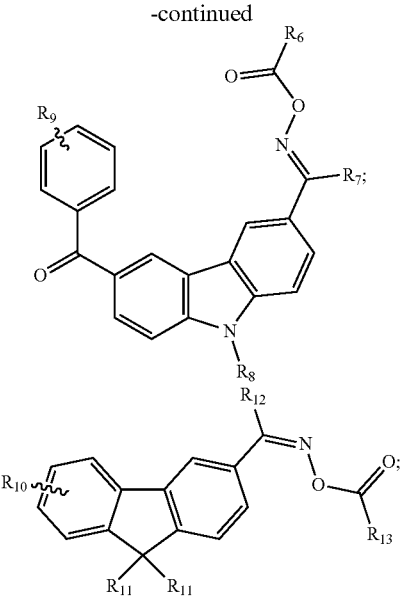

and combinations thereof, where $R_1$ is $CO_2Ph$, $CO_2Me$ or $CO_2Et$; $R_2$ is ketone, aryl, aryl ether, sulfide aryl ether or alkyl; $R_3$ is H, OH, COOH, methyl; each of $R_4$ and $R_5$ is independently an alkyl group having 1-10 carbon atoms, a cycloalkyl group or a phenyl group; each of $R_6$ and $R_7$ is independently an alkyl group having 1-10 carbon atoms, a cycloalkyl group or a phenyl group; $R_8$ is an alkyl group having 1 to 5 carbon atoms; $R_9$ is H, methyl or acetyl; $R_{10}$ is $NO_2$ or ArCO; $R_{11}$ is an alkyl group of 1 to 6 carbon atoms; and each of $R_{12}$ and $R_{13}$ is independently an alkyl group having 1-10 carbon atoms, a cycloalkyl group or a phenyl group.

16. The photosensitive composition of claim 3, wherein the bismaleimide compound is represented by a general formula (I):

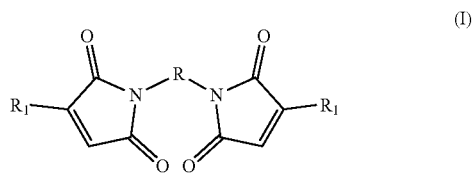
(I)

where R is substituted or unsubstituted linking group selected from the group consisting of alkylene, alkylenearyl, cycloalkylene, cycloalkylenearyl, cycloalkylalkylene and combinations thereof; and $R_1$ is selected from the group consisting of hydrogen, deuterium, halogen, cyano, methyl, vinyl, allyl, isoprene, and combinations thereof.

17. The photosensitive composition of claim 3, wherein the bismaleimide oligomer is represented by a general Formula (II):

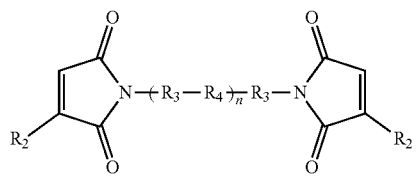
(II)
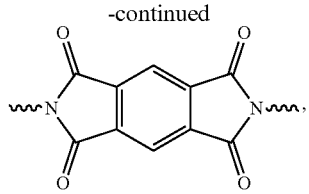
where $R_2$ is H or $CH_3$; $R_3$ is $C_1$-$C_{40}$ alkyl, alkyl polydimethyl siloxane, or alkylaryl; $R_4$ is selected from the group consisting of
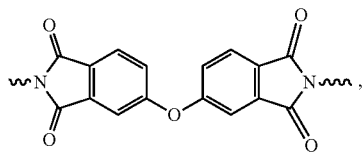
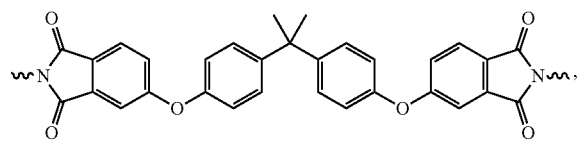
and combinations thereof, and n is an integer of 1 to 10.
* * * * *